(12) United States Patent
Mayol (10) Patent No.: US 12,446,274 B2
(45) Date of Patent: Oct. 14, 2025

(54) SEMICONDUCTOR DEVICE HAVING A TERMINATION REGION WITH DEEP TRENCH ISOLATION

(71) Applicant: Monolithic Power Systems, Inc., Kirkland, WA (US)

(72) Inventor: Ignacio Cortes Mayol, Spain (IT)

(73) Assignee: Monolithic Power Systems, Inc., Kirkland, WA (US)

( * ) Notice: Subject to any disclaimer, the term of this patent is extended or adjusted under 35 U.S.C. 154(b) by 492 days.

(21) Appl. No.: 18/080,938

(22) Filed: Dec. 14, 2022

(65) Prior Publication Data

US 2024/0204043 A1    Jun. 20, 2024

(51) Int. Cl.
*H10D 62/10* (2025.01)
*H10D 30/65* (2025.01)
*H10D 64/00* (2025.01)

(52) U.S. Cl.
CPC ......... *H10D 62/113* (2025.01); *H10D 30/655* (2025.01); *H10D 64/111* (2025.01)

(58) Field of Classification Search
CPC .. H10D 62/113; H10D 30/655; H10D 30/665; H10D 30/668; H10D 62/105; H10D 62/106; H10D 62/112
See application file for complete search history.

(56) References Cited

U.S. PATENT DOCUMENTS

| | | | |
|---|---|---|---|
| 2016/0087034 A1* | 3/2016 | You | H10D 62/111 |
| | | | 438/294 |
| 2018/0342497 A1* | 11/2018 | Kim | H10D 84/853 |
| 2019/0043943 A1* | 2/2019 | Yoshida | H10D 30/63 |
| 2021/0126125 A1* | 4/2021 | Grote | H10D 30/663 |

OTHER PUBLICATIONS

Hanseob Cha, Kyungho Lee, Junghwan Lee, Taejong Lee, 0.18μm 100V-rated BCD with Large Area Power LDMOS with ultra-low effective Specific Resistance, Proceedings of the 2016 28th International Symposium on Power Semiconductor Devices and ICs (ISPSD), pp. 423-426, Jun. 12-16, 2016, Prague, Czech Republic.
Namkyu Park, et al. aBCD18—an advanced 0.18um BCD Technology for PMIC Application, IEEE Proceedings, pp. 231-234, 2009.

(Continued)

*Primary Examiner* — Syed I Gheyas
(74) *Attorney, Agent, or Firm* — Perkins Coie LLP (57) ABSTRACT

A semiconductor device having a termination region comprising deep trench isolation ("DTI"). The termination region may be formed in a semiconductor layer of a first conductivity type and may include a vertical path cell of a second conductivity type vertically extended into the semiconductor layer with a vertical path cell depth, a first type deep trench termination cell ("DTTC") disposed laterally immediately next to the vertical path cell and including a first DTI and a first well region of the second conductivity type disposed laterally immediately next to the first DTI, and a second type DTTC having a second DTI disposed laterally immediately next to the first type DTTC, and a second well region of the first conductivity type disposed laterally immediately next to the second DTI.

22 Claims, 8 Drawing Sheets

(56) References Cited

OTHER PUBLICATIONS

Mun Nam Chil, et al. Advanced 300mm 130nm BCD technology from 5V to 85V with Deep-Trench Isolation, Proceedings of the 2016 28th International Symposium on Power Semiconductor Devices and ICs (ISPSD), pp. 403-406, Jun. 12-16, 2016, Prague, Czech Republic.

Jaroslav Pjencak, et al. Electric Field Engineering to Extend Capability of NLDMOS from 70V to 90V Without Added Cost, Proceedings of the 2020 32nd International Symposium on Power Semiconductor Devices and ICs (ISPSD), pp. 400-403, Sep. 13-18, 2020, Vienna, Austria.

Sharon Levin, et al. Isolated Silicon Platforms for high Current Power Management Integrated Circuit Applications, IEEE Proceedings, 4 p. retrieved Dec. 4, 2021.

Texas Instruments, Latch-Up, White Paper, SCAA124, Apr. 2015, 10 p.

Anne Watson and Steven H. Voldman, The Effect of Deep Trench and Sub-collector on the Latchup Robustness in BiCMOS Silicon Germanium Technology, IEEE 2004, p. 172-175.

* cited by examiner

SEMICONDUCTOR DEVICE HAVING A TERMINATION REGION WITH DEEP TRENCH ISOLATION

TECHNICAL FIELD

This disclosure relates generally to semiconductor devices, and more particularly but not exclusively relates to termination structure in semiconductor devices.

BACKGROUND

High voltage semiconductor devices, such as high voltage metal oxide semiconductor field effect transistors ("MOSFETs"), junction field effect transistors ("JFETs"), and double diffused metal-oxide semiconductor (DMOS) transistors etc. are widely used in various power management applications, including used as power switching elements in power management devices for industrial and/or consumer electronic equipment. In most high power applications, transistors with high voltage tolerance, low on resistance and high power handling capacity with good ruggedness are desired.

In addition, higher voltage tolerance capacity required in new BCD technologies specially for automotive applications brings to a trade-off between a static breakdown voltage of a high voltage transistor and a substrate injection at an edge termination of the high voltage transistor since higher breakdown voltage needs a reduction in dopant concentration of a P type substrate (or epitaxial layer) and/or a reduction in dopant concentration of an N type buried layer which results in higher device substrate carrier injection and higher latch-up problems.

SUMMARY

There has been provided, in accordance with an embodiment of the present disclosure, a semiconductor device comprising a semiconductor layer of a first conductivity type; a core active region formed in the semiconductor layer; and a termination region formed at a periphery area of the semiconductor device.

In accordance with an embodiment, the termination region may comprise a vertical path cell of a second conductivity type, disposed laterally immediately next to the core active region, and vertically extended from a top surface of the semiconductor layer into the semiconductor layer with a vertical path cell depth, the second conductivity type being opposite to the first conductivity type. The termination region may further comprise a first type deep trench termination cell, disposed laterally immediately next to the vertical path cell, and comprising a first deep trench isolation and a first well region of the second conductivity type disposed laterally immediately next to first deep trench isolation. The termination region may further comprise a second type deep trench termination cell comprising a second deep trench isolation disposed laterally immediately next to the first type deep trench termination cell, and a second well region of the first conductivity type disposed laterally immediately next to the second deep trench isolation.

There has also been provided, in accordance with an embodiment of the present disclosure a semiconductor device comprising: a semiconductor layer of a first conductivity type; a core active region formed in the semiconductor layer; and a termination region comprising: a vertical path cell of a second conductivity type, disposed laterally immediately next to the core active region, and vertically extending from a top surface of the semiconductor layer into the semiconductor layer with a vertical path cell depth, the second conductivity type being opposite to the first conductivity type; a plurality of first type deep trench termination cells, arranged in parallel and next to the vertical path cell, wherein each one of the plurality of first type deep trench termination cells comprises a first deep trench isolation and a first well region disposed laterally immediately next to the first deep trench isolation; and a second type deep trench termination cell comprising a second deep trench isolation disposed laterally immediately next to the first type deep trench termination cell that is farthest from the vertical path cell, and a second well region of the first conductivity type disposed laterally immediately next to the second deep trench isolation.

BRIEF DESCRIPTION OF DRAWINGS

The following detailed description of various embodiments of the present invention can best be understood when read in conjunction with the following drawings, in which the features are not necessarily drawn to scale but rather are drawn as to best illustrate the pertinent features.

DETAILED DESCRIPTION

Various embodiments of the present invention will now be described. In the following description, some specific details, such as example circuits and example values for these circuit components, are included to provide a thorough understanding of embodiments. One skilled in the relevant art will recognize, however, that the present invention can be practiced without one or more specific details, or with other methods, components, materials, etc. In other instances, well-known structures, materials, processes or operations are not shown or described in detail to avoid obscuring aspects of the present invention.

Throughout the specification and claims, the terms "left," right," "in," "out," "front," "back," "up," "down, "top," "atop", "bottom," "over," "under," "above," "below" and the like, if any, are used for descriptive purposes and not necessarily for describing permanent relative positions. It is to be understood that the terms so used are interchangeable under appropriate circumstances such that embodiments of the technology described herein are, for example, capable of operation in other orientations than those illustrated or otherwise described herein. The term "coupled," as used herein, is defined as directly or indirectly connected in an electrical or non-electrical manner. The terms "a," "an," and "the" includes plural reference, and the term "in" includes "in" and "on". The phrase "in one embodiment," as used herein does not necessarily refer to the same embodiment, although it may. The term "or" is an inclusive "or" operator, and is equivalent to the term "and/or" herein, unless the context clearly dictates otherwise. Where either a field effect transistor ("FET") or a bipolar junction transistor ("BJT") may be employed as an embodiment of a transistor, the scope of the words "gate", "drain", and "source" includes "base", "collector", and "emitter", respectively, and vice versa. The symbols "+" and "−" when used to describe dopants or doped regions/zones are merely used to descriptively indicate relative dopant concentration levels, but not intend to specify or limit the dopant concentration ranges, nor intend to add other limitations to the dopants and doped regions/zones. For instance, both "N+ type" and "N− type" can be referred to as "N type" in more general terms, and both "P+ type" and "P− type" can be referred to as "P type" in more general terms. Those skilled in the art should understand that the meanings of the terms identified above do not necessarily limit the terms, but merely provide illustrative examples for the terms.

The terms "comprise", "include", "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus.

With BCD technologies, semiconductor device such as high voltage lateral transistor may be fabricated in or on a semiconductor layer (e.g. semiconductor substrate) that may include a core active region and a termination region. The core active region usually comprises at least one transistor cell having a gate, a drain region, and a source region. The gate regulates the conduction and blocking of a channel region in the substrate to control an electrical current flow between the drain region and the source region. The termination region should serve to isolate, i.e., to block or reduce undesired electrical leakage paths, between the core active region and neighboring stages located near the active region or the high voltage lateral transistor. The termination region may further help to fully exploit the high voltage capability of the high voltage lateral transistor, i.e., capability to sustain maximum drain to source voltage that the transistor can assume/withstand without breakdown. The maximum drain to source voltage that the high voltage lateral transistor can assume/withstand without breakdown may generally also be referred to as a breakdown voltage. Embodiments of the present invention propose an isolation structure comprising deep trench isolation ("DTI") formed in the termination region. Thanks to high aspect ratio of DTI, the use of DTI in the isolation structure may advantageously allow a considerable reduction in an area taken by the termination region compared to conventional semiconductor device using junction (e.g. P-N junction) isolation in the termination region. Lower area taken by the termination region may beneficially save more area for the core active region in or on the semiconductor substrate, and thus the number of transistor cells formed in the core active region may be increased, which is beneficial to reducing an on resistance Ron or a specific on resistance Ron*A of the transistor and improving the current handling ability of the transistor, wherein A indicates area of the core active region. However, DTI may suffer from electric field crowding effect at for example a boundary between the DTI and the semiconductor layer, limiting the high voltage tolerance performance of the high voltage lateral transistor. Embodiments of the present invention thus further propose various isolation structures comprising DTI with alleviated or reduced electric field crowding effect at the boundary between the DTI and the semiconductor layer to improve the high voltage tolerance performance of the high voltage lateral transistor. The improvement of the isolation performance and voltage tolerance properties of the termination region is beneficial to increasing the breakdown voltage and ruggedness of the transistor. In addition to these beneficial features, the isolation structure with DTI may also be used for isolation between chip stages which may also contribute to area reduction between chip stages.

For convenience of explanation, the present disclosure takes a lateral asymmetric transistor manufactured on and/or in semiconductor substrates for example for the explanation, but this is not intended to be limiting and persons of ordinary skill in the art will understand that the structure and principles taught herein also apply to other types of semiconductor materials and devices as well. While poly-silicon is preferred for forming the gate of the transistors used in embodiments of the present disclosure, the embodiments are not limited to this choice of conductor, and other types of materials (e.g., metals, other semiconductors, semi-metals, and/or combinations thereof) that are compatible with other aspects of the device manufacturing process may be used.

Figure 1:
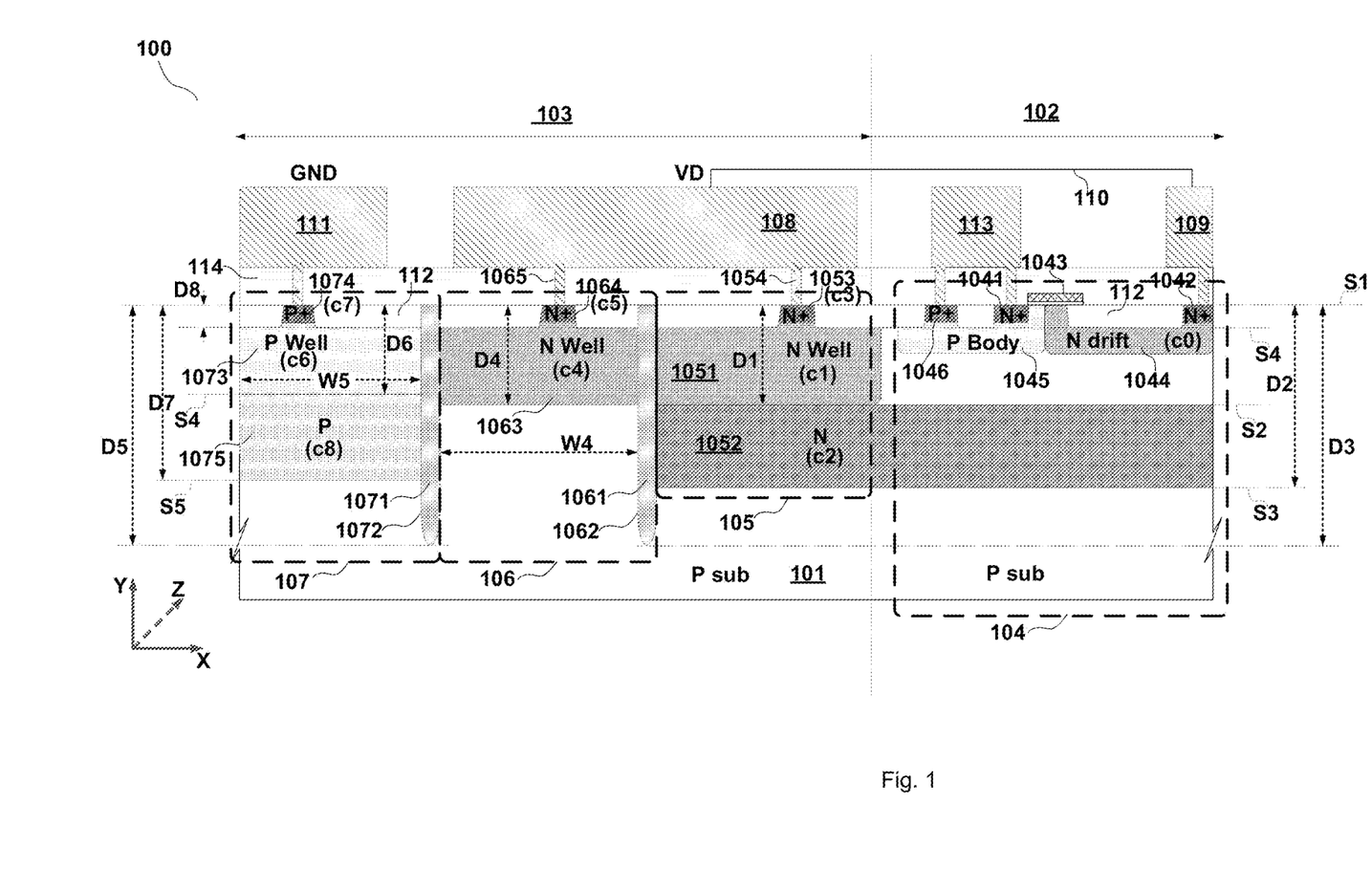
FIG. 1 illustrates a cross sectional view of a semiconductor device 100 in accordance with an embodiment of the present invention.
Figure 2:
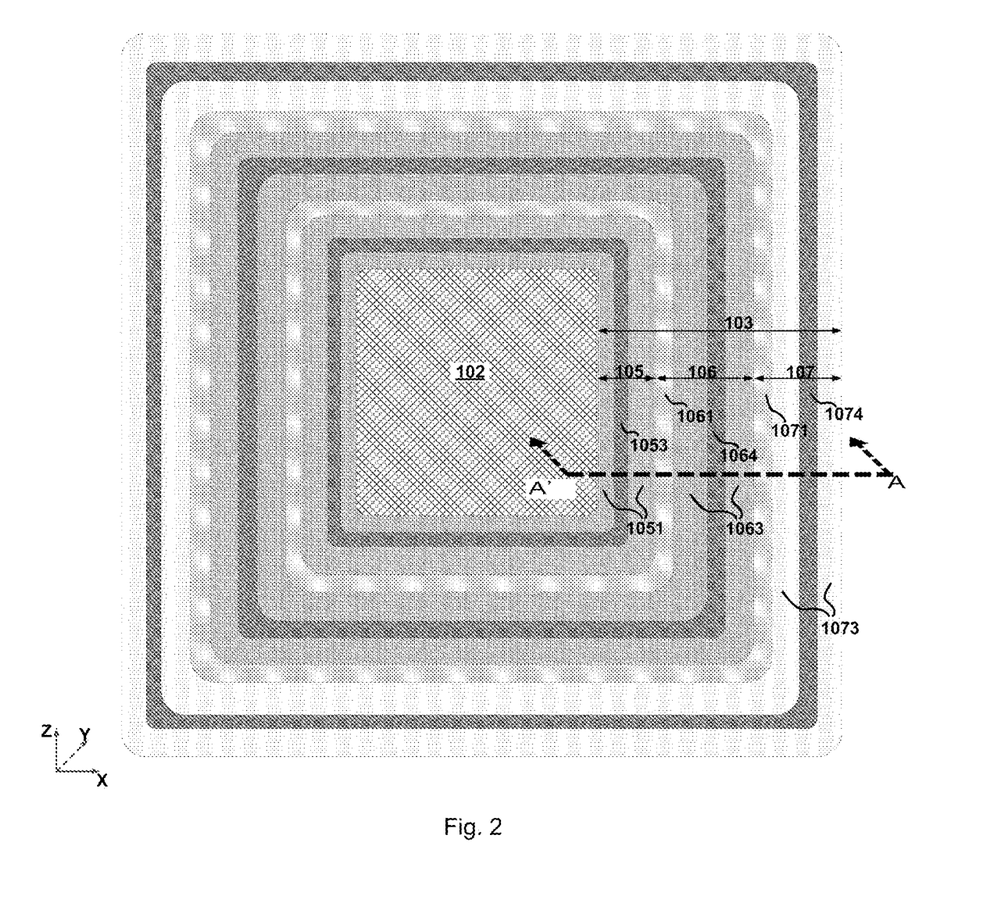
FIG. 2 illustrates schematically a top plan view of the semiconductor device 100 in accordance with an embodiment of the present invention.

FIG. 1 illustrates a cross sectional view of a semiconductor device 100 in accordance with an embodiment of the present invention. FIG. 2 illustrates schematically a top plan view of the semiconductor device 100 in accordance with an embodiment of the present invention. One having ordinary skill in the art should understand that the cross-sectional view in FIG. 1 and the top plan view in FIG. 2 illustrate actually portions of an entire die of the semiconductor device 100, and may be considered as illustrated out in a 3 dimensional coordinate system having the X axis, Y axis and Z axis perpendicular to one another. It may be understood that the illustrative cross sectional view in FIG. 1 is inspected from/taken from a cutting plane parallel to the X-Y plane defined by the X and Y axis. For example, for better understanding, it may be considered that the cross-sectional view of FIG. 1 corresponds to the portion cut from the cutting line AA' in the top plan view of FIG. 2. However, it should be understood that the corresponding relationship provided herein between the cross-sectional view and the top plan view of the semiconductor device 100 illustrated in FIG. 1 and FIG. 2 is not intended to be limiting. Throughout this disclosure, lateral may refer to a direction parallel to the X axis while vertical may refer to a direction parallel to the Y axis.

The semiconductor device 100 may be formed in/on a semiconductor layer 101 of a first conductivity type (e.g. P type). The semiconductor layer 101 may be doped with the first conductivity type dopants to have a semiconductor layer dopant concentration. In an embodiment, the semiconductor layer 101 may comprise a substrate of the semiconductor device 100. In an embodiment, the semiconductor layer 101 may comprise a thick epitaxial layer formed on a substrate. In an embodiment, the semiconductor layer dopant concentration may be in a range from 1e14 cm$^{-3}$ to 1e20 cm$^{-3}$. The semiconductor layer 101 may comprise one or more of the semiconductor materials such as Si, Ge, SiC, SiGe, GaN, GaAs or other forms of semiconductor substrates.

In accordance with an exemplary embodiment of the present invention, the semiconductor device 100 may include for example a core active region 102 and a termination region 103. The core active region 102 may comprise lateral high voltage transistors, with each one of the lateral high voltage transistors comprising at least one transistor cell 104 having a gate (e.g. 1043 in FIG. 1), a drain region (e.g. 1042 in FIG. 1), and a source region (e.g. 1041 in FIG. 1). The gate 1043 may regulate the conduction and blocking of a channel region in the substrate to control an electrical current flow between the drain region 1042 and the source region 1043. In the example of FIG. 1, an N-channel lateral high-voltage (HV) asymmetric transistor cell 104, such as an N-channel lateral double diffused metal oxide field effect transistor ("DMOS") cell, is illustrated out to help understand several aspects of various embodiments of the present invention. The HV asymmetric transistor cell 104 according to an example may further comprise a drift region 1044 (e.g. an N drift region shown in FIG. 1) enclosing the drain region 1042 with at least a portion of the drift region 1044 extended laterally underneath the gate 1043. A shallow trench isolation ("STI") 112 may be formed in the drift region 1044. The STI 112 may be opened and extend from the top surface S1 of the semiconductor layer 101 into the semiconductor layer 101 with a STI depth D8. The HV asymmetric transistor cell 104 according to an example may further comprise a body region 1045 (e.g. a P body region shown in FIG. 1) enclosing the source region 1041 and a body contact region 1046 (e.g. a P+ body contact region shown in FIG. 1). The source region 1041 and the body contact region 1046 may be coupled to a source metal contact 113 in an embodiment. One of ordinary skill in the art would understand that this is just to provide an example and not intended to be limiting. Other types of transistor cells may be formed in the core active region 102.

Referring to the exemplary illustration in FIG. 2, the termination region 103 may locate at a periphery area of the semiconductor device 100, e.g. outside and surrounding the core active region 102 perceived from the X-Z plan view. One of ordinary skill in the art would understand that for helping to better understand certain features of various embodiments of the present invention, the illustrative top plan view of FIG. 2 may be considered as perceived from the a plan coplanar with the bottom surface S4 of the STIs 112. As shown in FIG. 2, the termination region 103 may have a planform geometry conformal with the core active region 102, for example shown as square planform geometry in FIG. 2. The termination region 103 thus extends or runs around an outer peripheral portion of the semiconductor device 100 to circumscribe the core active region 102 as perceived from the illustrative X-Z plan view in FIG. 2. In further embodiments, the core active region 102 and the termination region 103 may assume other planform shapes such as circle or closed polygonal shape etc.

Now turning back to FIG. 1, the termination region 103 may comprise a vertical path cell 105 of the second conductivity type, a first type deep trench termination cell 106 and a second type deep trench termination cell 107.

In accordance with an exemplary embodiment of the present invention, the vertical path cell 105 may be configured to define a periphery transition zone from the core active region 102 to the termination region 103. For example, the vertical path cell 105 may be formed or disposed immediately outside and laterally next to the core active region 102 as perceived from the cross-sectional view of FIG. 1, radiating/spreading outward from the core active region 102 to the termination region 103 as perceived from the top plan (X-Z plan) view of FIG. 2. The vertical path cell 105 thus runs around an outer peripheral of the core active region 102 to circumscribe the core active region 102 as perceived from the X-Z plan view, and may have a planform geometry conformal with the core active region 102.

In an embodiment, the vertical path cell 105 may comprise a first periphery well region 1051 of the second conductivity type (e.g. illustrated as an N Well in the example of FIG. 1) formed in the semiconductor layer 101. The first periphery well region 1051 may extend vertically from a top surface S1 of the semiconductor layer 101 down into the semiconductor layer 101 with a predetermined first periphery well depth D1 to reach and physically contact with a first buried layer 1052 of the second conductivity type (e.g. illustrated as an N buried layer in the example of FIG. 1). For instance, the first periphery well region 1051 may reach and physically contact with a top surface S2 of the first buried layer 1052. The first buried layer 1052 may be buried in the semiconductor layer 101 with a bottom surface S3 of the first buried layer 1052 substantially disposed at a predetermined vertical path cell depth D2 with reference to the top surface S1 of the semiconductor layer 101. For this situation, it may be understood that the vertical path cell 105 when considered in entirety actually forms a vertical path of the second conductivity extending from the top surface S1 of the semiconductor layer into the semiconductor layer 101 with the predetermined vertical path cell depth D2. The first periphery well region 1051 may be doped with dopants of the second conductivity type (e.g. N type dopants in the exemplary embodiment of FIG. 1) to have a first periphery well dopant concentration c1. In an embodiment, the first periphery well dopant concentration c1 may be in a range from $5e15$ $cm^{-3}$ to $1e18$ $cm^{-3}$. The first buried layer 1052 may be doped with dopants of the second conductivity type (e.g. N type dopants in the exemplary embodiment of FIG. 1) to have a first buried layer dopant concentration c2 that may be higher than the first periphery well dopant concentration c1, i.e. c2>c1. In an embodiment, the first buried layer dopant concentration c2 may be in a range from $1e18$ $cm^{-3}$ to $1e21$ $cm^{-3}$.

A path contact region 1053 of the second conductivity type (e.g. illustrated as an N+ contact region in the example of FIG. 1) may be formed in the first periphery well region 1051 near the top surface S1 of the semiconductor layer 101. The path contact region 1053 may be doped with dopants of the second conductivity type (e.g. N type dopants in the exemplary embodiment of FIG. 1) to have a path contact dopant concentration c3 that may be higher than the first periphery well dopant concentration c1, i.e. c3>c1, and thus may be referred to as being "highly doped" or "heavily doped" by those skilled in the art (e.g. illustrated as an N+ region in FIG. 1). In an embodiment, the path contact dopant concentration c3 may be in a range from $1e18$ $cm^{-3}$ to $1e21$ $cm^{-3}$.

In accordance with an exemplary embodiment of the present invention, the first type deep trench termination cell 106 may be configured to improve electrical field distribution (e.g., reducing electrical field density) at a boundary between the vertical path cell 105 and the first type deep trench termination cell 106, thereby advantageously helping to increase a breakdown voltage of the semiconductor device 100. In an embodiment, the first type deep trench termination cell 106 may be formed immediately next to the vertical path cell 105 as perceived from the cross-sectional view of FIG. 1 and located outside and surrounding (or circumscribing) the vertical path cell 105 as perceived from the illustrative top plan (X-Z plan) view of FIG. 2. The first type deep trench termination cell 106 thus extends or runs around an outer peripheral of the vertical path cell 105 to circumscribe the vertical path cell 105 as perceived from the illustrative X-Z plan view in FIG. 2, and may have a planform geometry conformal with the vertical path cell 105.

In an embodiment, the first type deep trench termination cell 106 may comprise a first deep trench isolation 1061 (will be referred to as the first DTI 1061 in the following) and a first well region 1063. The first DTI 1061 may be formed or disposed laterally (e.g. in the X-axis direction) immediately next to the vertical path cell 105 as perceived from the cross-sectional view of FIG. 1, and surrounding (or circumscribing) the vertical path cell 105 as perceived from the illustrative top plan (X-Z plan) view of FIG. 2, to isolate the first well region 1063 from the vertical path cell 105.

For instance, in an exemplary embodiment, the first DTI 1061 may comprise a first deep trench 1062 filled completely with insulation materials such as silicon dioxide. The first deep trench 1062 may have a deep trench bottom and deep trench sidewalls. In another exemplary embodiment, a thin insulator (e.g. silicon dioxide) liner may coat the deep trench bottom and deep trench sidewalls of the first deep trench 1062 and then a conductive filler such as polysilicon may be disposed over the insulator liner to fill the first deep trench 1062 to form the first DTI 1061. The first deep trench 1062 may be opened from the top surface S1 of the semiconductor layer 101 and penetrated vertically into the semiconductor layer 101 with a first deep trench depth D3 deeper than the vertical path cell depth D2, i.e. D3>D2. In an embodiment, a minimum depth value of the first deep trench depth D3 may be designed or determined to ensure that, when a voltage is applied or coupled to the vertical path cell 105, a bottom edge of a vertical depletion by the first buried layer 1052 to the semiconductor layer 101 should not reach the deep trench bottom of the first deep trench 1062. That is to say, the minimum depth value of the first deep trench depth D3 should be larger than a maximum depth of the bottom edge of the vertical depletion by the first buried layer 1052 to the semiconductor layer 101 can extend to when a voltage is applied or coupled to the vertical path cell 105. In an exemplary embodiment, the first deep trench depth D3 may further depend on the first dopant concentration of the semiconductor layer 101 and the voltage capability (i.e. breakdown voltage) of the HV asymmetric transistor cell 104. To provide an example, in one embodiment, the first deep trench depth D3 may be 2 to 4 times of the vertical path cell depth D2. To provide another example, the vertical path cell depth D2 may be in a range from 3 μm to 10 μm while the first deep trench depth D3 may be in a range from 6 μm to 40 μm. Laterally, i.e. observed from the X axis direction, the first deep trench 1062 and thus the first DTI 1061 may be located immediately next to the first periphery well region 1051 and the first buried layer 1052.

In an exemplary embodiment, the first well region 1063 may be of the second conductivity type (e.g. illustrated as an N Well in the example of FIG. 1) and may be configured to sustain high electrical field e.g. at breakdown voltage of the semiconductor device 100. In an embodiment, the first well region 1063 may extend vertically from the top surface S1 of the semiconductor layer 101 down into the semiconductor layer 101 with a predetermined first well depth D4. In an embodiment, the predetermined first well depth D4 may be smaller/shallower than the first deep trench depth D3, i.e. D3>D4. In an embodiment, the predetermined first well depth D4 may further be smaller/shallower than the vertical path cell depth D2, i.e. D2>D4. In an embodiment, the first well region 1063 may be doped with dopants of the second conductivity type (e.g. N type dopants in the exemplary embodiment of FIG. 1) to have a first well dopant concentration c4. In an embodiment, the first well region 1063 may be formed in the same fabrication process as the first periphery well region 1051 to save process cost, and thereby the first well dopant concentration c4 may be substantially identical to the first periphery well dopant concentration c1 for this situation. However, one of ordinary skill in the art should understand that this is just to provide an example and is not intended to be limiting. In alternative embodiments, the first well region 1063 may be formed in different fabrication process from the first periphery well region 1051. For instance, in an alternative embodiment, the first well region 1063 may be formed in the same fabrication process as the drift region 1044 of the transistor cell 104 to save process cost, and thereby the first well dopant concentration c4 may be substantially identical to a drift dopant concentration c0 of the drift region 1044 for this situation. The drift dopant concentration c0 may be lower than the first periphery well dopant concentration c1, i.e. c0<c1. Laterally, the first well region 1063 may be disposed immediately outside and next to the first DTI 1061 and may have a predetermined first well width W4 as perceived from the cross-sectional view of FIG. 1. When perceived from the illustrative top plan (X-Z plan) view in FIG. 2, one of ordinary skill in the art would understand that the first well region 1063 may extend around or surround or circumscribe the first DTI 1061, radiating/spreading outward from the first DTI 1061 with the predetermined first well width W4.

A first well contact region 1064 of the second conductivity type (e.g. illustrated as an N+ contact region in the example of FIG. 1) may be formed in the first well region 1063 near the top surface S1 of the semiconductor layer 101. The first well contact region 1064 may be doped with dopants of the second conductivity type (e.g. N type dopants in the exemplary embodiment of FIG. 1) to have a first well contact dopant concentration c5 that may be higher than the first well dopant concentration c4, i.e. c5>c4, and thus may be referred to as being "highly doped" or "heavily doped" by those skilled in the art (e.g. illustrated as an N+ region in FIG. 1). In an embodiment, the first well contact dopant concentration c5 may be in a range from 1e19 $cm^{-3}$ to 1e21 $cm^{-3}$. In an embodiment, the first well contact region 1064 may be formed in the same fabrication process as the path contact region 1053 to save process cost, and thereby the first well contact dopant concentration c5 may be substantially identical to the path contact dopant concentration c3 for this situation. However, one of ordinary skill in the art should understand that this is just to provide an example and is not intended to be limiting. In alternative embodiments, the first well contact region 1064 may be formed in different fabrication process from the path contact region 1053.

In accordance with an exemplary embodiment of the present invention, the vertical path cell 105 and the first well region 1063 of the first type deep trench termination cell 106 may be electrically coupled together through a path cell metal contact 108. For instance, the path cell metal contact 108 may be formed atop an interlayer dielectric layer ("IDL") 114 which may be disposed on the top surface S1 of the semiconductor layer 101. Interlayer vias 1054 and 1065 filled with conductive materials such as metal may be formed in the IDL 114 to respectively couple the vertical path cell 105 and the first well region 1063 to the path cell contact 108. In an embodiment, the vertical path cell 105 and the first well region 1063 may further be electrically coupled to the drain region 1042 of the lateral high voltage transistor in the active region 102, for example, illustrated by a connection line 110 coupling the path cell metal contact 108 to a drain metal contact 109 which is connected to the drain region 1042 in FIG. 1. In practical applications, the vertical path cell 105 may generally be coupled to a positive voltage such as a drain voltage applied to the drain region 1042 of the high voltage N-channel lateral transistor in the active region 102 to prevent any P-N junction forward conduction in the termination region 103, preventing carrier injection to the active region 102.

In accordance with an exemplary embodiment of the present invention, the second type deep trench termination cell 107 may be configured to provide a continuous path of the first conductivity type to enable/allow the semiconductor layer 101 being biased to for example a ground potential in practical application and reduce carrier injection to the active region 102. In an embodiment, the second type deep trench termination cell 107 may be formed immediately next to the first type deep trench termination cell 106 as perceived from the cross-sectional view of FIG. 1 and located outside and surrounding (or circumscribing) the first type deep trench termination cell 106 as perceived from the illustrative top plan (X-Z plan) view of FIG. 2. The second type deep trench termination cell 107 thus extends or runs around an outer peripheral of the first type deep trench termination cell 106 to circumscribe the first type deep trench termination cell 106 as perceived from the illustrative X-Z plan view in FIG. 2, and may have a planform geometry conformal with the first type deep trench termination cell 106.

In an embodiment, the second type deep trench termination cell 107 may comprise a second deep trench isolation 1071 (will be referred to as the second DTI 1071 in the following) and a second well region 1073. The second DTI 1071 may be formed or disposed laterally (e.g. in the X-axis direction) immediately next to the first type deep trench termination cell 106 as perceived from the cross-sectional view of FIG. 1, and located outside and surrounding (or circumscribing) the first type deep trench termination cell 106 as perceived from the illustrative top plan (X-Z plan) view of FIG. 2, to isolate the second well region 1073 from the first type deep trench termination cell 106.

For instance, in an exemplary embodiment, the second DTI 1071 may comprise a second deep trench 1072 filled completely with insulation materials such as silicon dioxide. The second deep trench 1072 may have a deep trench bottom and deep trench sidewalls. In another exemplary embodiment, a thin insulator (e.g. silicon dioxide) liner may coat the deep trench bottom and deep trench sidewalls of the second deep trench 1072 and then a conductive filler such as polysilicon may be disposed over the insulator liner to fill the second deep trench 1072 to form the second DTI 1071. The second deep trench 1072 may be opened from the top surface S1 of the semiconductor layer 101 and penetrated vertically into the semiconductor layer 101 with a second deep trench depth D5 deeper than the vertical path cell depth D2, i.e. D5>D2. In an exemplary embodiment, the second deep trench depth D5 may be 2 to 4 times of the vertical path cell depth D2. To provide an example, the vertical path cell depth D2 may be in a range from 3 µm to 10 µm while the second deep trench depth D5 may be in a range from 6 µm to 40 µm. In an embodiment, the second deep trench 1072 may be formed in the same fabrication process as the first deep trench 1062 to save process cost, and thereby the second deep trench depth D5 may be substantially identical to the first deep trench depth D3 for this situation. However, one of ordinary skill in the art should understand that this is just to provide an example and is not intended to be limiting. In other alternative embodiments, the second deep trench depth D5 may be different from the first deep trench depth D3. Laterally, i.e. observed from the X axis direction, the second deep trench 1072 and thus the second DTI 1071 may be located immediately next to the first well region 1063.

In an exemplary embodiment, the second well region 1073 may be of the first conductivity type (e.g. illustrated as a P Well in the example of FIG. 1). In an embodiment, the second well region 1073 may extend vertically from the top surface S1 of the semiconductor layer 101 down into the semiconductor layer 101 with a predetermined second well depth D6. In an embodiment, the predetermined second well depth D6 may be smaller/shallower than the second deep trench depth D5, i.e. D6<D5. In an embodiment, the predetermined second well depth D6 may further be smaller/shallower than the vertical path cell depth D2, i.e. D6<D2. In an embodiment, the second well region 1073 may be doped with dopants of the first conductivity type (e.g. P type dopants in the exemplary embodiment of FIG. 1) to have a second well dopant concentration c6. Laterally, the second well region 1073 may be disposed immediately outside and next to the second DTI 1071 and may have a predetermined second well width W5 as perceived from the cross-sectional view of FIG. 1. When perceived from the illustrative top plan (X-Z plan) view in FIG. 2, one of ordinary skill in the art would understand that the second well region 1073 may extend around or surround or circumscribe the second DTI 1071, radiating/spreading outward from the second DTI 1071 with the predetermined second well width W5.

A second well contact region 1074 of the first conductivity type (e.g. illustrated as a P+ contact region in the example of FIG. 1) may be formed in the second well region 1073 near the top surface S1 of the semiconductor layer 101. The second well contact region 1074 may be doped with dopants of the first conductivity type (e.g. P type dopants in the exemplary embodiment of FIG. 1) to have a second well contact dopant concentration c7 that may be higher than the second well dopant concentration c5, i.e. c7>c6, and thus may be referred to as being "highly doped" or "heavily doped" by those skilled in the art (e.g. illustrated as an P+ region in FIG. 1). In an embodiment, the second well contact dopant concentration c7 may be in a range from 1e19 cm$^{-3}$ to 1e21 cm$^{-3}$. For this situation, it may be understood that the second well region 1073 and the second well contact region 1074 when considered in entirety actually form a vertical path of the first conductivity extending from the top surface S1 of the semiconductor layer into the semiconductor layer 101 with the second well depth D6.

In accordance with an exemplary embodiment of the present invention, the second type deep trench termination cell 107 may further comprise a second buried layer 1075 of the first conductivity type (e.g. illustrated as a P buried layer in the example of FIG. 1). The second buried layer 1075 may be buried in the semiconductor layer 101 beneath the second well region 1073 with a bottom surface S5 of the second buried layer 1075 substantially disposed at a predetermined buried depth D7 with reference to the top surface S1 of the semiconductor layer 101. For this situation, the second well region 1073 may extend vertically from the top surface S1 of the semiconductor layer 101 down into the semiconductor layer 101 to reach and physically contact with the second buried layer 1075. For instance, the second well region 1073 may reach and physically contact with a top surface S4 of the second buried layer 1075. In an embodiment, the predetermined buried depth D7 may be shallower or smaller than the second deep trench depth D5, i.e. D7<D5. The second buried layer 1075 may be doped with dopants of the first conductivity type (e.g. P type dopants in the exemplary embodiment of FIG. 1) to have a second buried layer dopant concentration $c8$ that may be higher than the second well dopant concentration $c6$, i.e. $c8>c6$. In an embodiment, the second buried layer dopant concentration $c8$ may be in a range from $1e18\ cm^{-3}$ to $1e21\ cm^{-3}$. The second buried layer 1075 may advantageously help to reduce a parasitic collector resistance of a PNP parasitic bipolar transistor formed between the lateral high voltage transistor cells 104 and the second well contact region 1074. For this situation, it may be understood that the second well region 1073, the second well contact region 1074 and the second buried layer 1075 when considered in entirety actually form a vertical path of the first conductivity extending from the top surface S1 of the semiconductor layer into the semiconductor layer 101 with the predetermined buried depth D7.

In accordance with an exemplary embodiment of the present invention, the second well region 1073, the second well contact region 1074 and the second buried layer 1075 (if the second buried layer 1075 is formed) may be electrically coupled to a ground potential GND through a second well metal contact 111. In this fashion, in practical applications, the semiconductor layer 101 may be biased to the ground potential GND, preventing carrier injection to the active region 102.

In accordance with an exemplary embodiment of the present invention, the contact regions such as the path contact region 1053, the first well contact region 1064, and the second well contact region 1074 may be isolated by shallow trench isolations 112 having the DTI depth D8.

The semiconductor device 100 as described above with reference to FIG. 1 may have improved breakdown voltage with diagonal equipotential distribution in the first type deep trench termination cell 106. The semiconductor device 100 may further have improved substrate noise immunity (immunity of carrier injection from the semiconductor layer/substrate 101 to the active region 102) and latch-up immunity with reduction of a size of the termination region 103.

Figure 3:
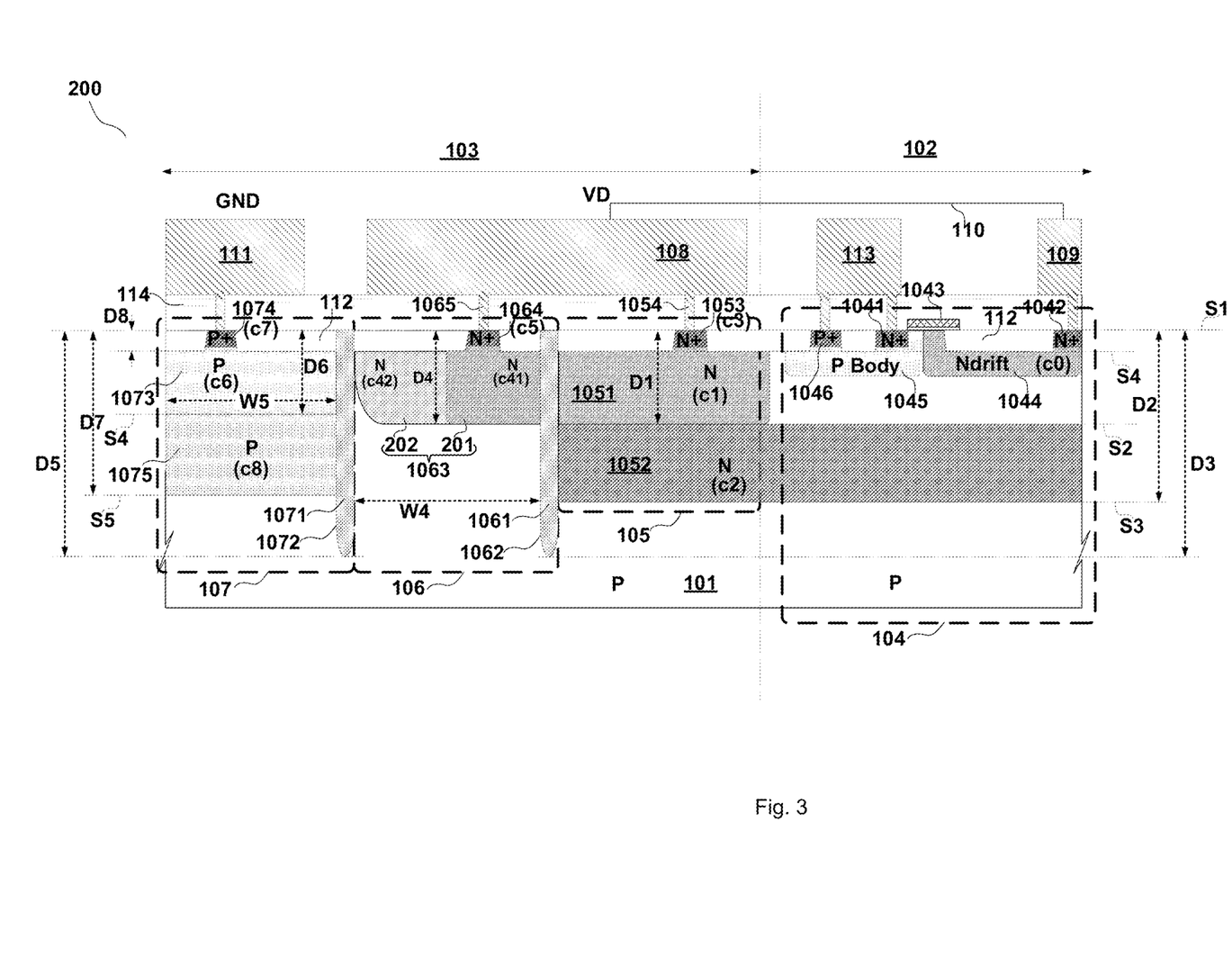
FIG. 3 illustrates a cross sectional view of a semiconductor device 200 in accordance with an alternative embodiment of the present invention.

FIG. 3 illustrates a cross sectional view of a semiconductor device 200 in accordance with an alternative embodiment of the present invention. Components or structures or elements in the semiconductor device 200 with substantially the same functions as those of the semiconductor device 100 are identified by the same reference labels as used in the semiconductor device 100 for the sake of simplicity. One of ordinary skill in the art would understand that the semiconductor device 200 may be considered as a variant from the semiconductor device 100. Those skilled in the art should understand that the above descriptions to the semiconductor device 100 of the various embodiments of the present disclosure made with reference to FIG. 1 and FIG. 2 are applicable to the semiconductor device 200 in the example of FIG. 3. Difference of the semiconductor device 200 from the semiconductor device 100 described above mainly lies in that the first well region 1063 in the first type deep trench termination cell 106 may have graded or stepped voltage or potential distribution when a voltage VD is applied or coupled to the first well region 1063, to guarantee a more uniform electric field distribution and improve the voltage tolerance capability of the termination region. For instance, the voltage VD may be applied or coupled to the first well region 1063 through the path cell metal contact 108 and the first well contact region 1064. In the example illustrated in FIG. 3, the first well region 1063 of the semiconductor device 200 may comprise a plurality of second-conductivity-type dopant zones wherein each one of the plurality of second-conductivity-type dopant zones has a zone dopant concentration, a zone depth with reference to the top surface S1 of the semiconductor layer 101 and a zone width. One of ordinary skill in the art would understand that the plurality of second-conductivity-type dopant zones may be arranged one around another like rings as perceived from the top plan (X-Z plan) perpendicular to the vertical direction (Y axis). For instance, two second-conductivity-type dopant zones 201 and 202 are illustrated out in FIG. 3 to help understand the embodiment. In an exemplary embodiment, the plurality of second-conductivity-type dopant zones may have degrading zone dopant concentrations in the direction from the dopant zone immediately neighboring and surrounding the first DTI 1061 to the dopant zone farthest from the first DTI 1061. For example, in FIG. 3, the dopant zone 202 located farther from the first DTI 1061 may have a zone dopant concentration $c42$ that is lighter than a zone dopant concentration $c41$ of the dopant zone 201 located closer to the first DTI 1061, i.e. $c42<c41$. In an exemplary embodiment, the zone dopant concentration $c41$ of the dopant zone 201 that is located immediately neighboring to/surrounding the first DTI 1061 may be identical to the first periphery well dopant concentration $c1$ of the first periphery well region 1051, i.e. $c41=c1$ in such an example. Whereas the zone dopant concentration $c42$ of the dopant zone 202 may be identical to the drift dopant concentration $c0$ of the drift region 1044 of the transistor cell 104, i.e. $c42=c0$. For this situation, the dopant zone 201 may be formed in a same implantation process as for forming the first periphery well region 1051 sharing one implantation mask. The dopant zone 202 may be formed in a same implantation process as for forming the drift region 1044 of the transistor cell 104 sharing another one implantation mask. In this fashion, no additional new mask is needed for forming the dopant zones 201 and 202 during the fabrication process. It can be appreciated by those of ordinary skill in the art that the number of the second-conductivity-type dopant zones, the zone dopant concentration of each second-conductivity-type dopant zone, and the width and depth of each second-conductivity-type dopant zone may be modified as required to optimize the performance of the high-voltage semiconductor device 200.

Figure 4:
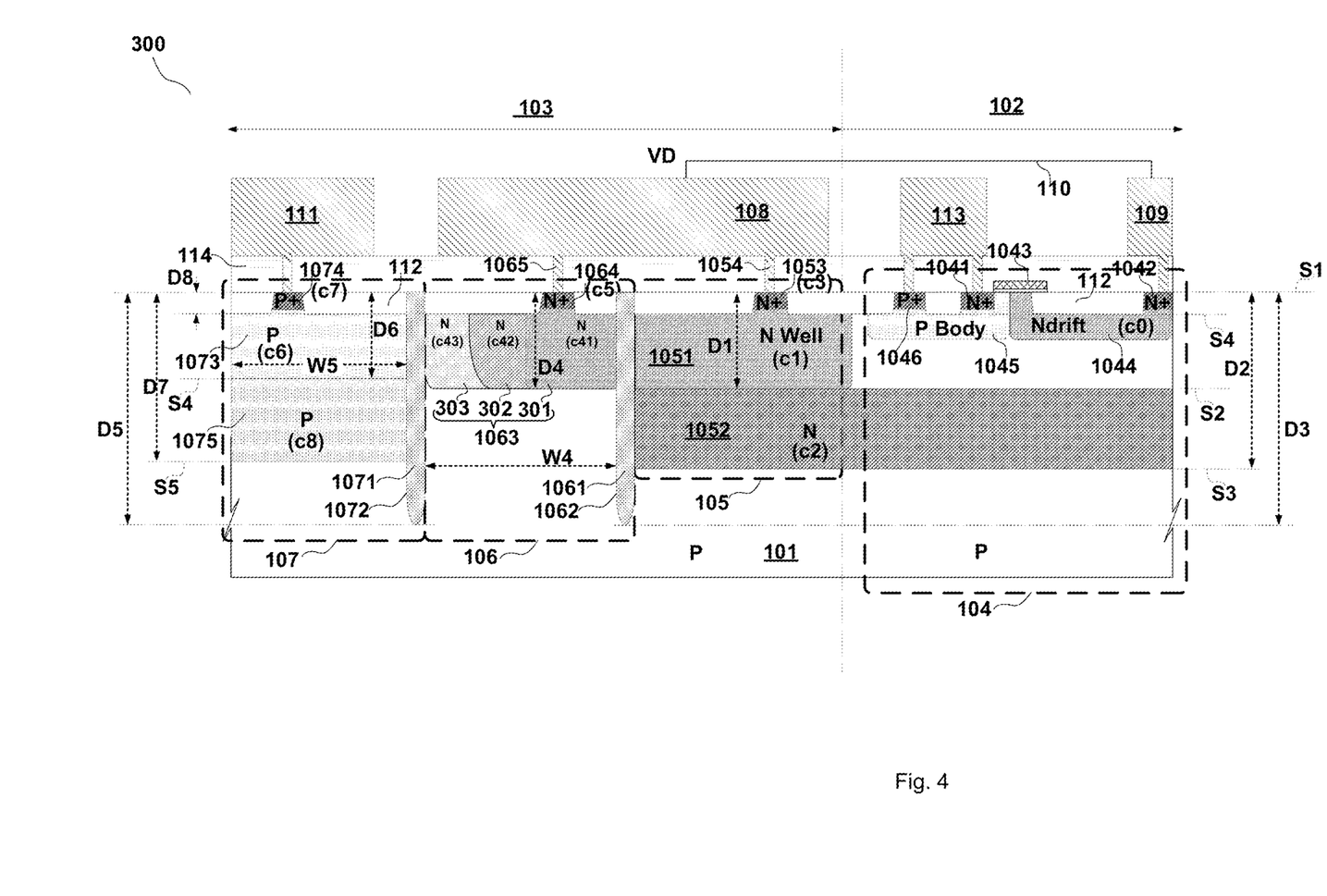
FIG. 4 illustrates a cross sectional view of a semiconductor device 300 in accordance with another alternative embodiment of the present invention.

To provide another example, FIG. 4 illustrates a cross section al view of a semiconductor device 300 in accordance with another alternative embodiment of the present invention. One of ordinary skill in the art would understand that the semiconductor device 300 may be considered as a variant from the semiconductor device 200. Those skilled in the art should understand that the above descriptions to the semiconductor devices 100 and 200 of the various embodiments of the present disclosure made with reference to FIG. 1 to FIG. 3 are applicable to the semiconductor device 300 in the example of FIG. 4. Difference of the semiconductor device 300 from the semiconductor device 200 described above mainly lies in that the first well region 1063 is exemplarily illustrated to comprise three second-conductivity-type dopant zones 301, 302 and 303 having degrading zone dopant concentrations in the direction from the dopant zone immediately neighboring and surrounding the first DTI 1061 to the dopant zone farthest from the first DTI 1061. That is to say, the dopant zone 303 located farthest from the first DTI 1061 may have a zone dopant concentration $c43$ that is lighter than a zone dopant concentration $c42$ of the dopant zone 302 located closer to the first DTI 1061, while the zone dopant concentration $c42$ may be lighter than a zone dopant concentration $c41$ of the dopant zone 301 located closest to the first DTI 1061, i.e. $c43<c42<c41$.

Figure 5:
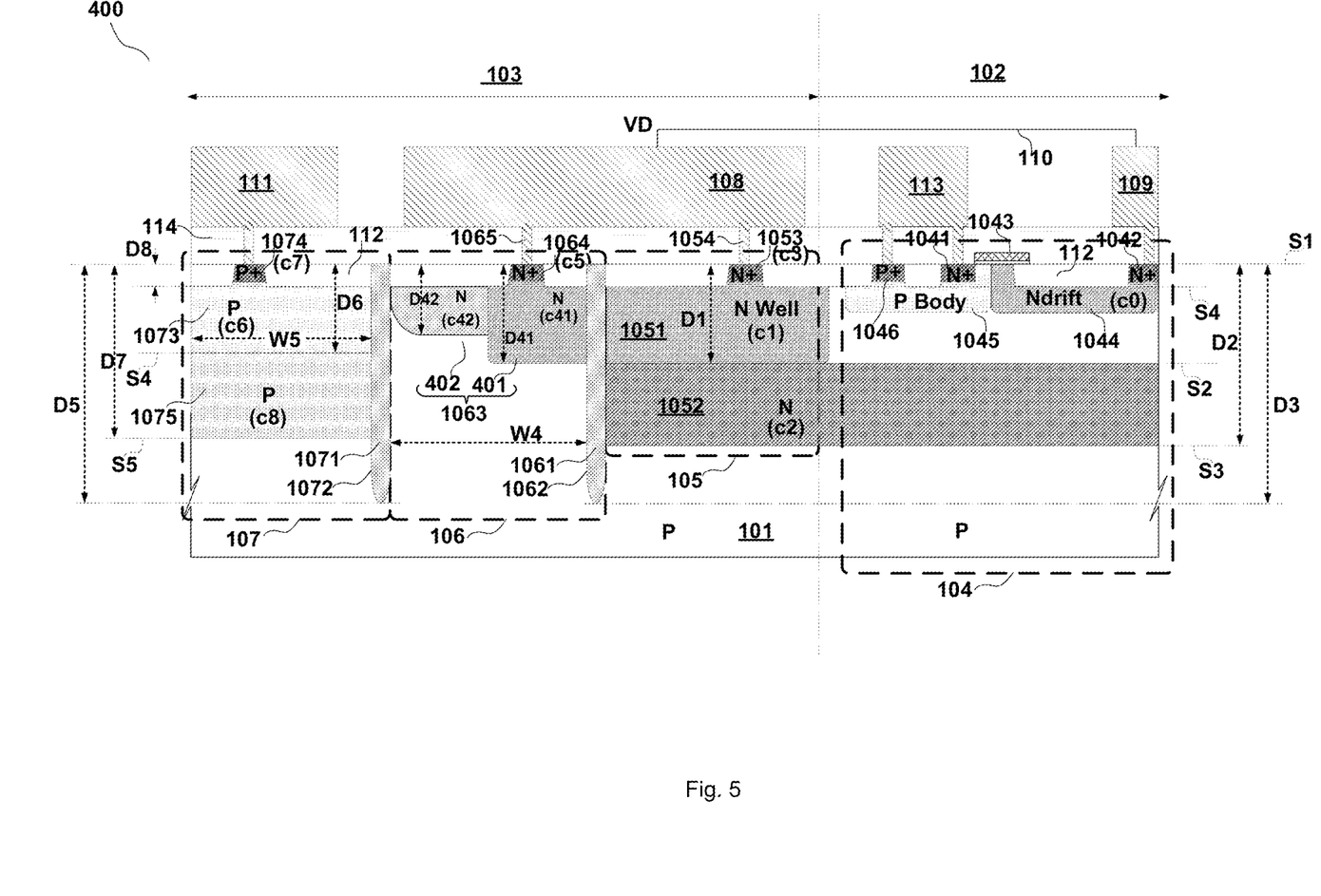
FIG. 5 illustrates a cross sectional view of a semiconductor device 400 in accordance with still another alternative embodiment of the present invention.
Figure 6:
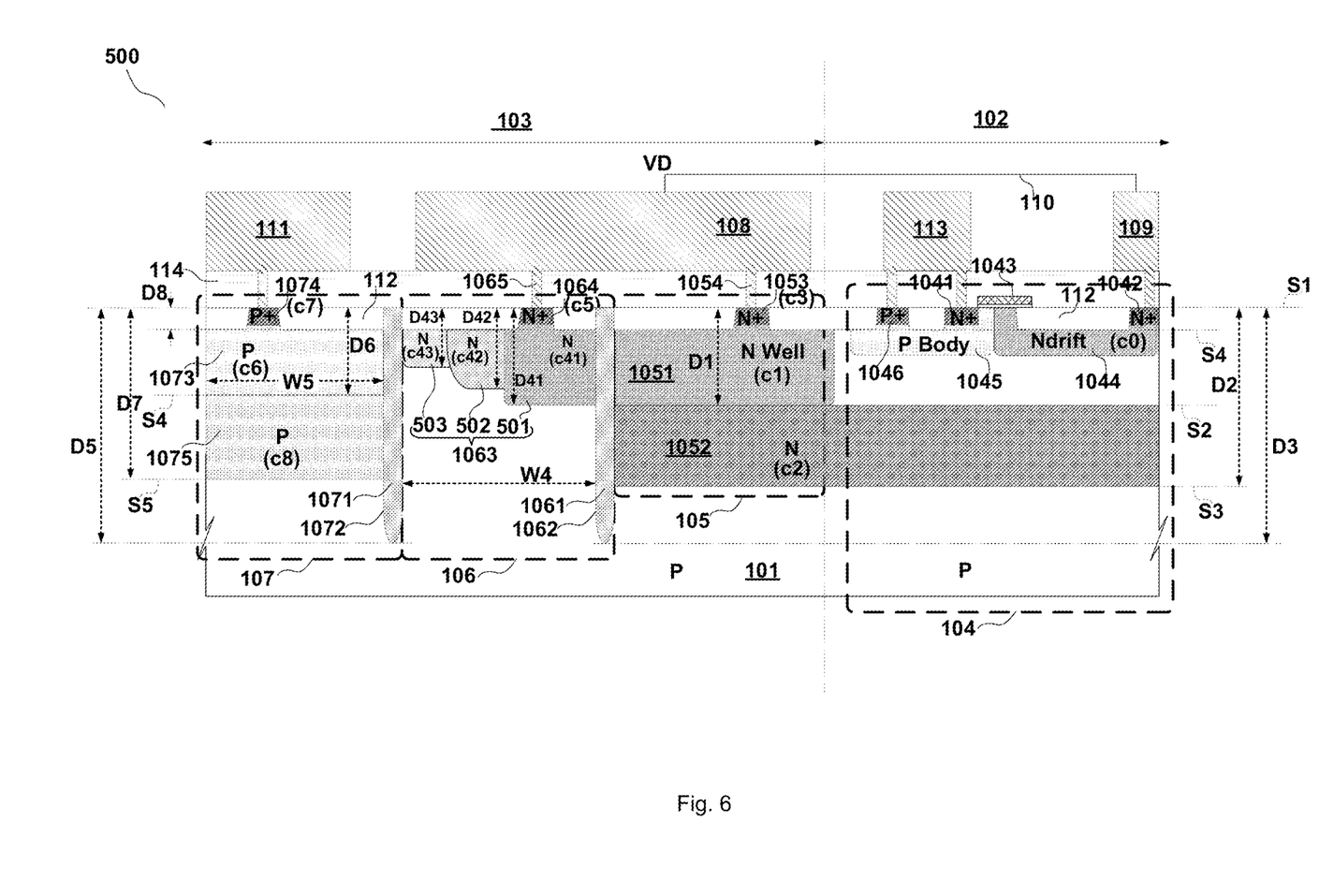
FIG. 6 illustrates a cross sectional view of a semiconductor device 500 in accordance with a further alternative embodiment of the present invention.

To provide still another two examples, FIG. 5 illustrates a cross sectional view of a semiconductor device 400 in accordance with still another alternative embodiment of the present invention. FIG. 6 illustrates a cross sectional view of a semiconductor device 500 in accordance with a further alternative embodiment of the present invention. Components or structures or elements in the semiconductor devices 400 and 500 with substantially the same functions as those of the semiconductor devices 100, 200 and 300 are identified by the same reference labels as used in the semiconductor devices 100, 200 and 300 for the sake of simplicity. One of ordinary skill in the art would understand that the semiconductor device 400 may be considered as another variant from the semiconductor device 200 while the semiconductor device 500 may be considered as a variant from the semiconductor device 300. Therefore, the above descriptions to the semiconductor devices 100 and 200 of the various embodiments of the present disclosure made with reference to FIG. 1 to FIG. 3 are applicable to the semiconductor devices 400 and 500. Difference of the semiconductor devices 400 and 500 from the semiconductor devices 200 and 300 described above mainly lies in that the plurality of second-conductivity-type dopant zones of the first well region 1063 may have degrading zone depths in the direction from the dopant zone immediately neighboring and surrounding the first DTI 1061 to the dopant zone farthest from the first DTI 1061. For this situation, in an embodiment, the plurality of second-conductivity-type dopant zones of the first well region 1063 may have identical zone dopant concentrations. While in an alternative embodiment, the plurality of second-conductivity-type dopant zones of the first well region 1063 may have degrading zone dopant concentrations in the direction from the dopant zone immediately neighboring and surrounding the first DTI 1061 to the dopant zone farthest from the first DTI 1061.

For instance, in FIG. 5, it is still illustrated as an example that the first well region 1063 of the semiconductor device 400 comprises two second-conductivity-type dopant zones 401 and 402. The dopant zone 402 located farther from the first DTI 1061 may have a zone depth $D42$ that is shallower or smaller than a zone depth $D41$ of the dopant zone 401 located closer to the first DTI 1061, i.e. $D42<D41$. For this situation, the dopant zone 402 located farther from the first DTI 1061 may have a zone dopant concentration $c42$ that is identical to or lighter than a zone dopant concentration $c41$ of the dopant zone 301 located closer to the first DTI 1061, i.e. $c42<c41$. In FIG. 6, it is illustrated as another example that the first well region 1063 of the semiconductor device 500 comprises three second-conductivity-type dopant zones 501, 502 and 503. The dopant zone 503 located farthest from the first DTI 1061 may have a zone depth $D43$ that is shallower or smaller than a zone depth $D42$ of the dopant zone 502 located closer to the first DTI 1061, while the zone depth $D42$ may be shallower or smaller than a zone depth $D41$ of the dopant zone 501 located closest to the first DTI 1061, i.e. $D43<D42<D41$. For this situation, the dopant zone 503 located farthest from the first DTI 1061 may have a zone dopant concentration $c43$ that is identical to or lighter than a zone dopant concentration $c42$ of the dopant zone 302 located closer to the first DTI 1061, while the zone dopant concentration $c42$ may be identical to or lighter than a zone dopant concentration $c41$ of the dopant zone 301 located closest to the first DTI 1061, i.e. $c43<c42\le c41$.

For the semiconductor devices 200, 300, 400 and 500 described in the above exemplary embodiments, the first well region 1063 in the first type deep trench termination cell 106 have graded or stepped voltage or potential distribution profile when a voltage VD is applied or coupled to the first well region 1063, for instance through the path cell metal contact 108 and the first well contact region 1064. Consequently when the voltage VD is applied or coupled to the path cell metal contact 108 (and thus to the vertical path cell 105 and the first well region 1063), the first well region 1063 may advantageously help to establish a more uniform electric field distribution in or across the vertical path cell 105 and the first type deep trench termination cell 106, alleviating the formation of high electric field locations (or electric field crowding locations) in or across the vertical path cell 105 and the first type deep trench termination cell 106. For example, the first well region 1063 may especially help to alleviate or reduce electric field crowding effect at or near the boundary between the vertical path cell 105 and the first type deep trench termination cell 106, i.e. at or near the boundary between the first DTI 1061 and the first periphery well region 1051/the first buried layer 1052, which may also be referred to as the boundary between the first DTI 1061 and the semiconductor layer 101. The first well region 1063 may especially further help to alleviate or reduce electric field crowding effect at or near the boundary between the first type deep trench termination cell 106 and the second type deep trench termination cell 107, i.e. at or near the boundary between the second DTI 1071 and the first well region 1063, which may also be referred to as the boundary between the second DTI 1071 and the semiconductor layer 101. Therefore, the high voltage tolerance performance of the isolation structures comprising DTI (e.g. DTIs 1061 and 1071) in the termination region 103 of the semiconductor devices 200, 300, 400 and 500 according to various embodiments of the present invention may be improved so that the semiconductor devices 200 300, 400 and 500 may have a further increased breakdown voltage.

In accordance with an exemplary embodiment of the present invention, still referring to the exemplary cross-sectional illustrations in FIG. 1 and FIG. 3 to FIG. 6, the path cell metal contact 108 may laterally extend to overlay a substantial portion of the first well region 1063 or more concretely to coat a substantial portion of the IDL 114 which is above the first well region 1063. For this situation, the path cell metal contact 108 may act or function as a field plate, which may advantageously help to capacitively deplete the first well region 1063. The path cell metal contact 108 or the field plate 108 may further help to improve the uniformity of electric field distribution in or across the vertical path cell 105 and the first type deep trench termination cell 106, alleviating the formation of high electric field locations in or across the vertical path cell 105 and the first type deep trench termination cell 106, thereby further improving the breakdown voltage of the semiconductor devices 100~500.

Figure 7:
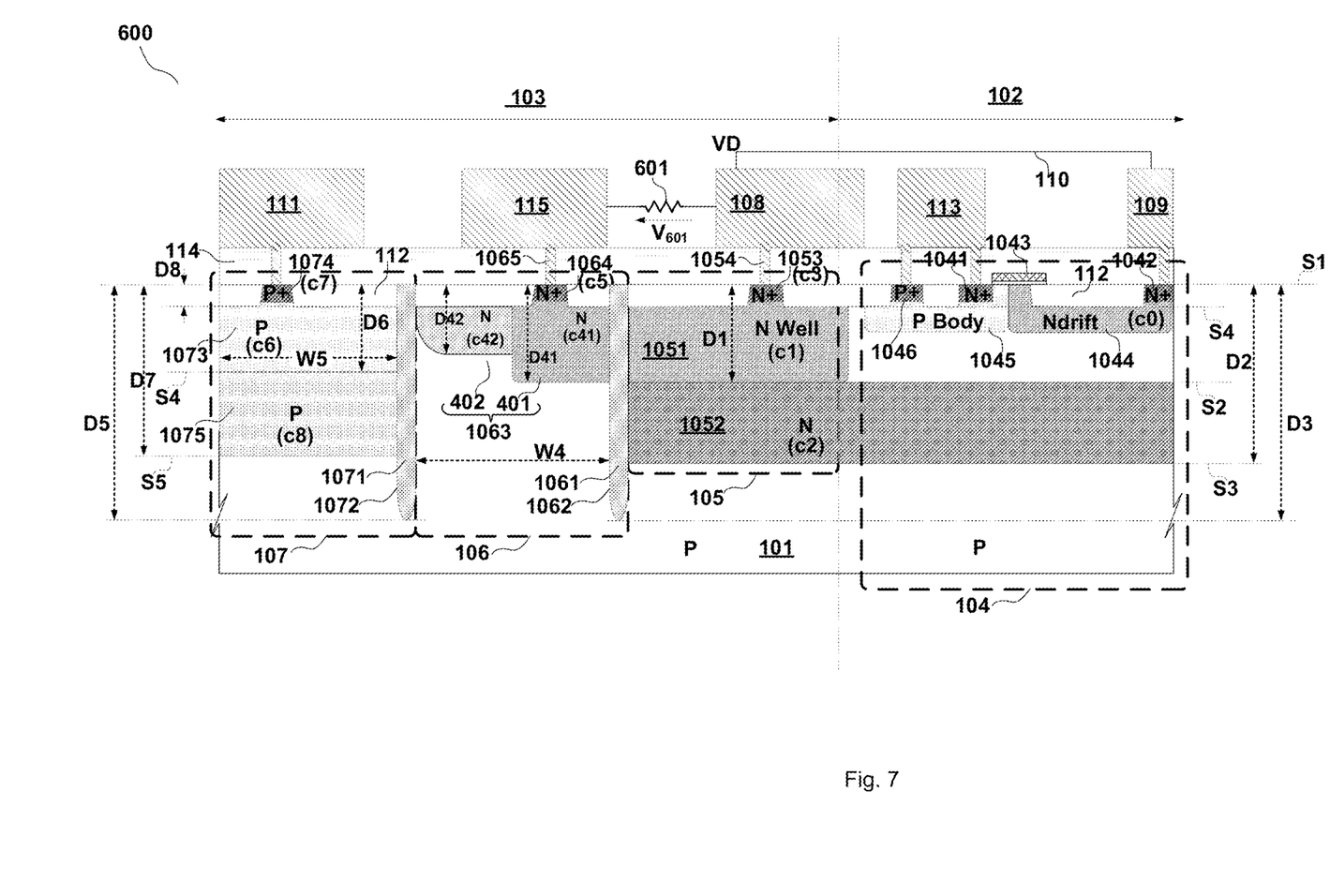
FIG. 7 illustrates a cross sectional view of a semiconductor device 600 in accordance with a still further alternative embodiment of the present invention.

FIG. 7 illustrates a cross sectional view of a semiconductor device 600 in accordance with a still further alternative embodiment of the present invention. Components or structures or elements in the semiconductor device 600 with substantially the same functions as those of the semiconductor devices 100, 200 and 400 are identified by the same reference labels as used in the semiconductor devices 100, 200 and 400 for the sake of simplicity. One of ordinary skill in the art would understand that the semiconductor device 600 may be considered a variant from the semiconductor device 400. Therefore, the above descriptions to the semiconductor devices 100, 200 and 400 of the various embodiments of the present disclosure made with reference to FIG.

1 to FIG. 3 and FIG. 4 are applicable to the semiconductor device 600. Difference of the semiconductor device 600 from the semiconductor device 400 described above mainly lies in that a first well metal contact 115 separated from the path cell metal contact 108 is formed above the first well region 1063 and a ballast resistor 601 may be electrically coupled between the first well metal contact 115 and the path cell metal contact 108. For this situation, the first well region 1063 of the first type deep trench termination cell 106 may be electrically coupled to the first well metal contact 114 through e.g. the first well contact region 1064 and the interlayer via 1065. With the ballast resistor 601 coupled between the first well metal contact 115 and the path cell metal contact 108, a voltage drop V601 across the ballast resistor 601 may result in voltage drop (potential decrement) from the vertical path cell 105 to the first type deep trench termination cell 106 when a voltage (e.g. the voltage VD) is applied to the path cell metal contact 108. Therefore, for this situation, the voltage applied to the first type deep trench termination cell 106 is reduced compared to the voltage applied to the vertical path cell 105. In this fashion, the high voltage tolerance capability (or the breakdown voltage) of the semiconductor device 600 may be further improved. It would be understood by those of ordinary skill in the art that, the variations described here with reference to FIG. 7 regarding the semiconductor device 600, which could be considered as a variant from the semiconductor device 400, could also be applied to the semiconductor devices 100, 200, 300 and 500.

One of ordinary skill in the art would understand that in accordance with other alternative embodiments of the present invention, semiconductor devices having a termination region comprising a plurality (e.g. more than one) of first type deep trench termination cells 106 are further disclosed. The plurality of first type deep trench termination cells 106 may be disposed laterally between the vertical path cell 105 and the second type deep trench termination cell 107. Each one of the plurality of first type deep trench termination cells 106 may comprise or have the structures or components or elements identical to those of the first type deep trench termination cell 106 in any one of the semiconductor devices 100~600 described above with reference to FIG. 1 to FIG. 6.

Figure 8:
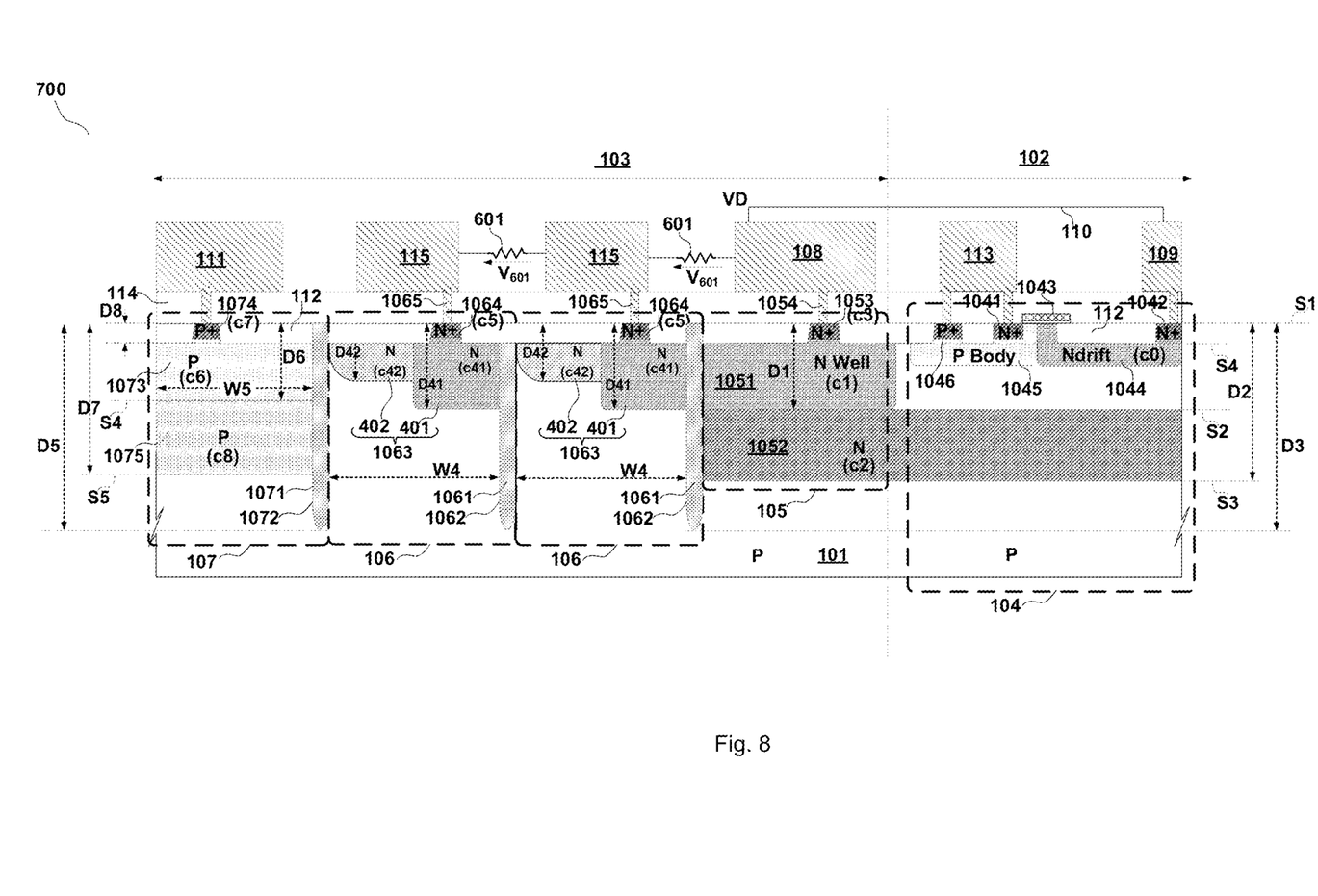
FIG. 8 illustrates a cross sectional view of a semiconductor device 700 in accordance with a still further alternative embodiment of the present invention.

For example, FIG. 8 illustrates a cross sectional view of a semiconductor device 700 in accordance with a still further alternative embodiment of the present invention. The semiconductor device 700 is exemplarily illustrated to comprise two first type deep trench termination cells 106 disposed laterally between the vertical path cell 105 and the second type deep trench termination cell 107. One of ordinary skill in the art would understand that the semiconductor device 700 may be considered as a variant from the semiconductor device 600. Components or structures or elements in the semiconductor device 700 with substantially the same functions as those of the semiconductor devices 100, 200, 400 and 600 are identified by the same reference labels as used in the semiconductor devices 100, 200, 400 and 600 for the sake of simplicity. Therefore, the above descriptions to the semiconductor devices 100, 200, 400 and 600 of the various embodiments of the present disclosure made with reference to FIG. 1, FIG. 2, FIG. 3, FIG. 5 and FIG. 7 are applicable to the semiconductor device 700 in the example of FIG. 8. Difference of the semiconductor device 700 from the semiconductor device 600 described above with reference to FIG. 7 mainly lies in that the termination region 103 of the semiconductor device 700 in FIG. 8 may comprise more than one of the first type deep trench termination cell 106.

For instance, two first type deep trench termination cells 106 disposed laterally between the vertical path cell 105 and the second type deep trench termination cell 107 are illustrated out in FIG. 8 just as an example. And in this example, each one of the two first type deep trench termination cells 106 is exemplarily illustrated to be identical to the first type deep trench termination cell 106 of the semiconductor device 600 as described with reference to FIG. 7. However, in another example, the two first type deep trench termination cells 106 may not have identical structures. For instance, one of them may have a structure identical to the first type deep trench termination cell 106 of the semiconductor device 600 as described with reference to FIG. 7 while the other one of them may have a structure identical to the first type deep trench termination cell 106 of any one of the semiconductor devices 100, 200, 300, 400 and 500 described above with reference to FIG. 1 to FIG. 6. One of ordinary skill in the art should understand that these examples are not intended to be limiting, the number of first type deep trench termination cells 106 that the termination region 103 comprising may not be limited to one or two, and each one of the plurality of first type deep trench termination cells 106 may have a structure identical to the first type deep trench termination cell 106 of any one of the semiconductor devices 100, 200, 300, 400, 500 and 600 described above with reference to FIG. 1 to FIG. 7. The advantages of the various embodiments of the present invention are not confined to those described above. These and other advantages of the various embodiments of the present invention will become more apparent upon reading the whole detailed descriptions and studying the various figures of the drawings.

From the foregoing, it will be appreciated that specific embodiments of the present invention have been described herein for purposes of illustration, but that various modifications may be made without deviating from the technology. Many of the elements of one embodiment may be combined with other embodiments in addition to or in lieu of the elements of the other embodiments. Accordingly, the present invention is not limited except as by the appended claims.

What is claimed is:
1. A semiconductor device comprising:
a semiconductor layer of a first conductivity type;
a core active region formed in the semiconductor layer; and
a termination region comprising:
a vertical path cell of a second conductivity type, disposed laterally immediately next to the core active region, and vertically extended from a top surface of the semiconductor layer into the semiconductor layer with a vertical path cell depth, the second conductivity type being opposite to the first conductivity type;
a first type deep trench termination cell, disposed laterally immediately next to the vertical path cell, and comprising a first deep trench isolation and a first well region of the second conductivity type disposed laterally immediately next to the first deep trench isolation; and
a second type deep trench termination cell comprising a second deep trench isolation disposed laterally immediately next to the first type deep trench termination cell, and a second well region of the first conductivity type disposed laterally immediately next to the second deep trench isolation.
2. The semiconductor device of claim 1, wherein the vertical path cell runs around an outer peripheral of the core active region to circumscribe the core active region as perceived from a plan perpendicular to the vertical direction.

3. The semiconductor device of claim 1, wherein the first deep trench isolation is disposed in a first deep trench opened from the top surface of the semiconductor layer and penetrated vertically into the semiconductor layer with a first deep trench depth deeper than the vertical path cell depth.

4. The semiconductor device of claim 3, wherein the first deep trench depth is 2 to 4 times of the vertical path cell depth.

5. The semiconductor device of claim 1, wherein the first deep trench isolation circumscribes the vertical path cell as perceived from a plan perpendicular to the vertical direction.

6. The semiconductor device of claim 1, wherein the first well region extends vertically from the top surface of the semiconductor layer down into the semiconductor layer with a predetermined first well depth, and wherein the predetermined first well depth is shallower than the vertical path cell depth.

7. The semiconductor device of claim 1, wherein the second deep trench isolation is disposed in a second deep trench opened from the top surface of the semiconductor layer and penetrated vertically into the semiconductor layer with a second deep trench depth deeper than the vertical path cell depth.

8. The semiconductor device of claim 7, wherein the second deep trench depth is 2 to 4 times of the vertical path cell depth.

9. The semiconductor device of claim 7, wherein the second well region extends vertically from the top surface of the semiconductor layer down into the semiconductor layer with a predetermined second well depth, and wherein the predetermined second well depth is shallower than the second deep trench depth.

10. The semiconductor device of claim 1, wherein the second deep trench isolation circumscribes the first deep trench termination cell as perceived from a plan perpendicular to the vertical direction.

11. The semiconductor device of claim 1, wherein the vertical path cell comprises:
  a first buried layer of the second conductivity type buried in the semiconductor layer with a bottom surface of the first buried layer substantially disposed at the vertical path cell depth;
  a first periphery well region of the second conductivity type formed in the semiconductor layer and extended vertically from the top surface of the semiconductor layer down into the semiconductor layer to reach and physically contact with the first buried layer; and
  a path contact region of the second conductivity type formed in the first periphery well region near the top surface of the semiconductor layer.

12. The semiconductor device of claim 1, wherein the first well region has graded voltage or potential distribution profile when a voltage is applied or coupled to the first well region.

13. The semiconductor device of claim 1, wherein the first well region comprises a plurality of second-conductivity-type dopant zones having degrading zone dopant concentrations in the direction from the dopant zone immediately neighboring and surrounding the first deep trench isolation to the dopant zone farthest from the first deep trench isolation.

14. The semiconductor device of claim 1, wherein the first well region comprises a plurality of second-conductivity-type dopant zones, and wherein each one of the plurality of second-conductivity-type dopant zones has a zone depth with reference to the top surface of the semiconductor layer, and wherein the zone depths of the plurality of second-conductivity-type dopant zones are degrading in the direction from the dopant zone immediately neighboring and surrounding the first deep trench isolation to the dopant zone farthest from the first deep trench isolation.

15. The semiconductor device of claim 1, wherein the second type deep trench termination cell further comprises:
  a second well contact region of the first conductivity type formed in the second well region near the top surface of the semiconductor layer.

16. The semiconductor device of claim 1, wherein the second type deep trench termination cell further comprises:
  a second buried layer of the first conductivity type buried in the semiconductor layer beneath the second well region with a bottom surface of the second buried layer substantially disposed at a predetermined buried depth.

17. The semiconductor device of claim 1, further comprising:
  a path cell metal contact electrically coupled to the vertical path cell and the first well region and extended laterally to overlay a substantial portion of the first well region to function as a field plate.

18. The semiconductor device of claim 1, further comprising:
  a path cell metal contact electrically coupled to the vertical path cell; and
  a first well metal contact electrically coupled to the first well region, wherein a ballast resistor is coupled between the path cell metal contact and the first well metal contact.

19. The semiconductor device of claim 1, wherein the termination region further comprises:
  a second first type deep trench termination cell having an identical structure as the first type deep trench termination cell, and disposed between the first type deep trench termination cell and the second type deep trench termination cell.

20. The semiconductor device of claim 18, the first deep trench isolation of each one of the plurality of first type deep trench termination cells is disposed in a first deep trench opened from the top surface of the semiconductor layer and penetrated vertically into the semiconductor layer with a first deep trench depth deeper than the vertical path cell depth.

21. The semiconductor device of claim 18, wherein the first well region of each one of the plurality of first type deep trench termination cells has graded voltage or potential distribution profile when a voltage is applied or coupled to the first well region.

22. A semiconductor device comprising:
  a semiconductor layer of a first conductivity type;
  a core active region formed in the semiconductor layer; and
  a termination region comprising:
  a vertical path cell of a second conductivity type, disposed laterally immediately next to the core active region, and vertically extending from a top surface of the semiconductor layer into the semiconductor layer with a vertical path cell depth, the second conductivity type being opposite to the first conductivity type;
  a plurality of first type deep trench termination cells, arranged in parallel and next to the vertical path cell, wherein each one of the plurality of first type deep trench termination cells comprises a first deep trench isolation and a first well region disposed laterally immediately next to the first deep trench isolation; and a second type deep trench termination cell comprising a second deep trench isolation disposed laterally immediately next to the first type deep trench termination cell that is farthest from the vertical path cell, and a second well region of the first conductivity type disposed laterally immediately next to the second deep trench isolation.

* * * * *